United States Patent
Waldmann et al.

(10) Patent No.: US 9,716,022 B2
(45) Date of Patent: Jul. 25, 2017

(54) METHOD OF DETERMINING THERMAL STABILITY OF A SUBSTRATE SUPPORT ASSEMBLY

(71) Applicant: Lam Research Corporation, Fremont, CA (US)

(72) Inventors: Ole Waldmann, Oakland, CA (US); Eric A. Pape, Campbell, CA (US); Carlos Leal-Verdugo, Fremont, CA (US); Keith William Gaff, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 782 days.

(21) Appl. No.: 14/109,020

(22) Filed: Dec. 17, 2013

(65) Prior Publication Data

US 2015/0168962 A1    Jun. 18, 2015

(51) Int. Cl.
*G05D 23/19*    (2006.01)
*G05B 19/418*    (2006.01)
*H01L 21/67*    (2006.01)

(52) U.S. Cl.
CPC ...... *H01L 21/67248* (2013.01); *G05B 19/418* (2013.01); *H01L 21/67103* (2013.01)

(58) Field of Classification Search
CPC ............ G05B 19/418; H01L 21/67248; H01L 21/67103
See application file for complete search history.

(56) References Cited

U.S. PATENT DOCUMENTS

| | | | |
|---|---|---|---|
| 6,351,723 B1 | 2/2002 | Maekawa | |
| 6,463,391 B1 | 10/2002 | Early | |
| 6,622,286 B1 | 9/2003 | Ngo et al. | |
| 6,794,302 B1 * | 9/2004 | Chen | H01J 37/32935 216/59 |
| 6,825,050 B2 | 11/2004 | Huang et al. | |
| 7,295,954 B2 | 11/2007 | Yadav et al. | |
| 7,311,782 B2 | 12/2007 | Strang et al. | |
| 7,404,123 B1 | 7/2008 | Ku et al. | |
| 7,496,473 B2 | 2/2009 | Lenz et al. | |
| 7,542,134 B2 | 6/2009 | Owczarz et al. | |
| 7,580,767 B2 | 8/2009 | MacDonald et al. | |
| 7,653,515 B2 | 1/2010 | Yadav et al. | |
| 7,813,893 B2 | 10/2010 | Fong et al. | |
| 7,899,627 B2 | 3/2011 | Huang et al. | |
| 7,952,049 B2 * | 5/2011 | Tsukamoto | H01L 21/67103 118/724 |
| 7,988,872 B2 * | 8/2011 | Brillhart | H01L 21/67109 216/67 |
| 8,164,033 B2 * | 4/2012 | Koshimizu | F27B 5/04 118/725 |
| 8,207,476 B2 * | 6/2012 | Tsukamoto | C23C 16/4586 118/724 |
| 8,449,174 B2 | 5/2013 | Gaff et al. | |
| 8,461,674 B2 | 6/2013 | Gaff et al. | |
| 8,608,900 B2 * | 12/2013 | Buchberger, Jr. | H01L 21/67069 118/708 |
| 2003/0216627 A1 | 11/2003 | Lorenz et al. | |
| 2007/0138166 A1 | 6/2007 | Fennewald et al. | |
| 2008/0017104 A1 | 1/2008 | Matyushkin et al. | |
| 2008/0018887 A1 | 1/2008 | Chen et al. | |
| 2008/0032426 A1 | 2/2008 | Michaelson et al. | |
| 2008/0228308 A1 | 9/2008 | Phelps | |
| 2009/0055126 A1 | 2/2009 | Yanovich et al. | |
| 2010/0078424 A1 * | 4/2010 | Tsukamoto | C23C 16/4586 219/444.1 |
| 2010/0332011 A1 | 12/2010 | Venugopal et al. | |
| 2010/0332014 A1 | 12/2010 | Albarede et al. | |
| 2011/0092072 A1 * | 4/2011 | Singh | C23C 14/541 438/710 |
| 2011/0143462 A1 | 6/2011 | Gaff et al. | |
| 2011/0207245 A1 * | 8/2011 | Koshimizu | F27B 5/04 438/9 |
| 2012/0031889 A1 | 2/2012 | Komatsu | |
| 2012/0115254 A1 | 5/2012 | Singh | |
| 2012/0226475 A1 | 9/2012 | Asai | |
| 2012/0238040 A1 * | 9/2012 | Kubota | H01J 37/32091 438/5 |
| 2012/0292308 A1 | 11/2012 | Fennewald et al. | |
| 2013/0068750 A1 | 3/2013 | Gaff et al. | |
| 2013/0072035 A1 | 3/2013 | Gaff et al. | |
| 2013/0105462 A1 | 5/2013 | Schmidt et al. | |
| 2013/0105463 A1 | 5/2013 | Schmidt et al. | |
| 2013/0105465 A1 | 5/2013 | Swanson et al. | |
| 2013/0171746 A1 | 7/2013 | Chang et al. | |
| 2013/0220989 A1 | 8/2013 | Pease et al. | |
| 2013/0235506 A1 | 9/2013 | Gaff et al. | |

\* cited by examiner

*Primary Examiner* — Charles Kasenge

(57) ABSTRACT

A method of determining thermal stability of an upper surface of a substrate support assembly comprises recording time resolved pre-process temperature data of the substrate before performing a plasma processing process while powering an array of thermal control elements to achieve a desired spatial and temporal temperature of the upper surface. A substrate is processed while powering the array of thermal control elements to achieve a desired spatial and temporal temperature of the upper surface of the assembly, and time resolved post-process temperature data of the assembly is recorded after processing the substrate. The post-process temperature data is recorded while powering the thermal control elements to achieve a desired spatial and temporal temperature of the upper surface. The post-process temperature data is compared to the pre-process temperature data to determine whether the data is within a desired tolerance range.

21 Claims, No Drawings

METHOD OF DETERMINING THERMAL STABILITY OF A SUBSTRATE SUPPORT ASSEMBLY

FIELD OF THE INVENTION

The present invention relates to plasma processing apparatuses, and more specifically to statistical process control of a plasma processing apparatus.

BACKGROUND

Integrated circuits are formed from a substrate or semiconductor substrate over which are formed patterned microelectronics layers. In the processing of the substrate, plasma is often employed to deposit films on the substrate or to etch intended portions of the films. Shrinking feature sizes and implementation of new materials in next generation microelectronics layers have put new requirements on plasma processing equipment. During plasma processing, hundreds of substrates may be processed. However, not all processed substrates are of acceptable quality standard. The smaller features, larger substrate sizes, and new processing techniques require improvement in plasma processing apparatuses to control the conditions of the plasma processing, and among other things, this calls for plasma processing apparatuses with improved uniformity, consistency, and self-diagnostics. Therefore, to identify the substrates that may not be of acceptable quality standard, fault detection may be implemented. As discussed herein, fault detection refers to the process of identifying potential problematic substrates.

SUMMARY

Disclosed herein is a method of determining thermal stability of an upper surface of a substrate support assembly in a plasma processing apparatus wherein the substrate support assembly includes an array of thermal control elements, wherein one or more thermal control elements of the array of thermal control elements form independently controllable heater zones of the substrate support assembly, and wherein the array of thermal control elements are operable to control the spatial and temporal temperature of the upper surface of the substrate support assembly. The method comprises recording time resolved pre-process temperature data of the substrate support assembly before performing a plasma processing process while powering the array of thermal control elements to achieve a desired spatial and temporal temperature of the upper surface of the substrate support assembly. A substrate or a batch of substrates are processed in the plasma processing apparatus while powering the array of thermal control elements to achieve a desired spatial and temporal temperature of the upper surface of the substrate support assembly, and time resolved post-process temperature data of the substrate support assembly is recorded after processing the substrate or the batch of substrates, wherein the post-process temperature data is recorded while powering the array of thermal control elements to achieve a desired spatial and temporal temperature of the upper surface of the substrate support assembly. The post-process temperature data is compared to the pre-process temperature data, and it is determined whether the post-process temperature data is within a desired tolerance range of the pre-process temperature data.

DETAILED DESCRIPTION

In the following description, numerous specific details are set forth in order to provide a thorough understanding of embodiments described herein. However, it will be apparent to one skilled in the art that the embodiments described may be practiced without some of these specific details. In other instances, implementation details and process operations have not been described in detail, if already well known. Additionally, as used herein, the term "about" when used with reference to numerical values refers to ±10%.

Various embodiments described herein include methods and techniques as well as articles of manufacture such as those that include a computer readable medium on which computer-readable instructions, such as a software algorithm, for carrying out embodiments described herein are stored, as well as control systems for controlling embodiments described herein. The computer readable medium may include, for example, semiconductor, magnetic, opto-magnetic, optical, or other forms of computer readable medium for storing computer readable code. Further, embodiments described herein can include apparatuses such as circuits, dedicated and/or programmable, to carry out tasks pertaining to methods disclosed herein. Examples of such apparatuses include a general-purpose computer and/or a dedicated computing device when appropriately programmed and may include a combination of a computer/computing device and dedicated/programmable circuits adapted for the various tasks pertaining to embodiments described herein.

A substrate support assembly may be configured for a variety of functions during semiconductor plasma processing, such as supporting a semiconductor substrate, tuning the substrate temperature wherein an array of thermal control elements can be used to tune the temperature of an upper surface of the substrate support assembly, and supplying radio frequency power. Exemplary embodiments of substrate support assemblies and heating arrangements for substrate support assemblies can be found in commonly-assigned U.S. Pat. No. 8,461,674, commonly-assigned U.S. Published Application Nos. 2011/0092072, 2013/0072035, 2013/0068750, 2012/0115254, 2013/0220989, and 2011/0143462, and commonly-assigned U.S. patent application Ser. No. 13/908,676, all of which are hereby incorporated by reference in their entirety. An exemplary embodiment of a power supply and power switching system for a substrate support assembly including an array of thermal control elements electrically connected to the power supply and power switching system can be found in commonly-assigned U.S. patent application Ser. No. 13/690,745, which is hereby incorporated by reference in its entirety.

The substrate support assembly can comprise an electrostatic chuck (ESC) useful for electrostatically clamping the substrate onto an upper surface of the substrate support assembly during processing. The substrate support assembly may comprise a ceramic substrate holder, a fluid-cooled heat sink (i.e. a cooling plate), a heater plate, and a plurality of independently controllable heater zones to realize step by step and radial temperature control, azimuthal temperature control, and/or die by die temperature control of the substrate support assembly. For example, in an embodiment, the fluid-cooled heat sink can be maintained between about −20° C. and 80° C. wherein an array of thermal control elements (heaters) can maintain the upper surface, and thereby a substrate supported on the upper surface, of the substrate support assembly at temperatures of about 0° C. to 90° C. above the fluid cooled heat sink temperature. Independently controllable heater zones can be formed by controlling the heater power supplied to each thermal control element of the array of thermal control elements thus allowing the temperature profile of the upper surface of the substrate support assembly, and thereby the temperature profile of the substrate supported on the upper surface of the substrate support assembly, to be spatially and/or temporally controlled.

However, controlling temperature is not an easy task for several reasons. First, many factors can affect heat transfer, such as the locations of heat sources and heat sinks, the RF profile, and the movement, materials, and shapes of the media. Second, heat transfer is a dynamic process. Unless the system in question is in heat equilibrium, heat transfer will occur and the temperature profile and heat transfer will change with time. Third, non-equilibrium phenomena, such as plasma generated during plasma processing make theoretical prediction of the heat transfer behavior of any practical plasma processing apparatus very difficult if not impossible. Fourth, temperatures on the upper surface of the substrate support at positions between two or more thermal control elements forming an independently controllable heater zone can be greater than a known temperature of each respective thermal control element thereby increasing the difficulty of monitoring the temperature profile of the upper surface of the substrate support assembly, and thereby the temperature profile of the substrate supported on the upper surface of the substrate support assembly.

Even with multiple independently controllable heater zones in the substrate support assembly formed by the array of thermal control elements and underlying heat sinks, processing conditions controlled by the substrate support assembly may change over time when multiple substrates or multiple batches of substrates are processed. Further, while processing a substrate in the plasma processing apparatus, changing processing conditions can cause noise to be collected by the sensors monitoring the temperature data. Therefore, noise is preferably filtered from the monitored processing temperature data. Therefore, it is desirable to monitor the thermal stability of multiple independently controllable heater zones in the substrate support assembly to enable the apparatus to actively create and maintain a desired spatial and temporal temperature profile of the upper surface of the substrate support assembly. Thus, utilizing statistical process control, and preferably noise filtering techniques, the upper surface temperature of the substrate support assembly can be determined, monitored, and/or stabilized with respect to the spatial and temporal temperature profile (i.e. the temperature output) of the upper surface of the substrate support assembly. In this manner manufacturing costs and process errors associated with processing semiconductor substrates such as non-uniformity in the processing etch or deposition rates across a substrate or batch of substrates to be processed can be reduced.

As the term is employed herein, statistical analysis or statistical process control (SPC) refers to the analysis of the statistical behavior of a measured parameter or a derived parameter or a group of measured or derived parameters of temperature data, and to compare such behavior with historical (baseline) statistical limits. Such statistical analysis or SPC may yield information regarding whether the measured parameter is within an acceptable range, such as a hard or soft tolerance range, or whether a particular subsystem or system of the plasma processing apparatus exhibits behaviors or trends indicative of a particular process state of failure, fault, or other problems. SPC can be used to determine the thermal stability of upper surface temperature of a substrate support assembly, to monitor parameters and derived parameters which control the thermal output of the substrate support assembly, and to control the temperature output of the substrate support assembly (i.e. the temperature of an upper surface of the substrate support).

To determine the thermal stability of an upper surface of a substrate support assembly in a plasma processing apparatus, time resolved pre-process temperature data (pre-processed temperature data) of the substrate support assembly can be recorded before performing a plasma processing process in the plasma processing apparatus, wherein the array of thermal control elements are powered to achieve a desired spatial and temporal temperature of the upper surface of the substrate support assembly. After the pre-processed temperature data of the substrate support assembly is recorded, a substrate or a batch of substrates can be processed in the plasma processing apparatus while the array of thermal control elements are powered to achieve a desired processing spatial and temporal temperature of the upper surface of the substrate support assembly. After processing the substrate, the batch of substrates, or in an alternate embodiment multiple batches of substrates, time resolved post-process temperature data (post-process temperature data) of the substrate support assembly is recorded while the array of thermal control elements are powered to achieve the desired spatial and temporal temperature of the upper surface of the substrate support assembly. Preferably the pre-process temperature data and the post-process temperature data are recorded under the same conditions, and while powering the array of thermal control elements to achieve the same desired spatial and temporal temperature of the upper surface of the substrate support assembly. The post-process temperature data is compared to the pre-process temperature data wherein it is determined whether the post-process temperature data is within a desired tolerance range of the pre-process temperature data. By determining if the post-process temperature data is within a desired tolerance range of the pre-process temperature data, changing properties of the substrate support assembly can be monitored wherein the properties of the substrate support assembly are subject to change as a function of use. As a consequence, the thermal performance of the substrate support assembly which may change as a function of use, and thereby cause a corresponding change in the substrate temperature, can be monitored, detected, and/or stabilized.

In a preferred embodiment, the method preferably comprises recording time resolved process temperature data (process temperature data) while processing the substrate or the batch of substrates while powering the array of thermal control elements to achieve a desired processing spatial and temporal temperature of the upper surface of the substrate support assembly. The time resolved process temperature data can be used to establish baseline temperature data wherein noise and outlier temperature data are preferably filtering from the process temperature data, or the process temperature data can be compared to known baseline temperature data wherein it can be determined whether the process temperature data is within a desired tolerance range of the baseline temperature data thus allowing changing processing conditions of the substrate support assembly to be monitored while processing the substrate or the batch of substrates. The baseline temperature data can be known temperature data, based on numeric or analytical modeling, assumed spatial profiles of the individual thermal control elements wherein for example a Gaussian profile is used to calculate the assumed spatial profiles, or as real spatial characteristics of the substrate support as measured by independent means such as a dummy wafer or IR thermometer. Pre-process temperature data can also be used to form an initial baseline to determine the relationship between temperature output of the substrate support assembly and power input to the thermal control elements which can be compared to subsequent pre-process temperature data which is collected later in time. Further, the process temperature data can be used to adjust the baseline temperature data to account for changing conditions of the substrate support assembly. An exemplary method of determining and adjusting baseline temperature data can be found in commonly-assigned U.S. Pat. No. 7,899,627 which is hereby incorporated by reference in its entirety.

In an embodiment, the method further includes outputting, displaying, and/or storing the pre-process temperature data, the post-process temperature data, the comparison between the pre-process temperature data and the post-process temperature data, and/or the determination of whether the post-process temperature data is within the desired tolerance range of the pre-process temperature data. In a preferred embodiment, the method further includes outputting, displaying, and/or storing the process temperature data, the comparison between the process temperature data and the baseline temperature data, and/or the determination of whether the process temperature data is within the desired tolerance range of the baseline temperature data.

If the post-process temperature data is outside of the desired tolerance range of the pre-process temperature data, or alternatively, the process temperature data is outside of the desired tolerance range of the baseline temperature data, a user is preferably alerted. In an embodiment, the desired tolerance range includes a soft tolerance range wherein a user is warned if the post-process temperature data is outside of the soft tolerance range of the pre-process temperature data, or alternatively the process temperature data is outside of the soft tolerance range of the baseline temperature data. The desired tolerance level also preferably includes a hard tolerance range wherein a user is warned or a future plasma process is stopped if the post-process temperature data is outside of the hard tolerance range of the pre-process temperature data, or alternatively the process temperature data is outside of the hard tolerance range of the baseline temperature data. The soft and hard tolerance ranges may be established to determine when the thermal stability of the substrate support assembly is degrading or the thermal stability of the substrate support assembly is considered as unacceptable. The soft tolerance range and hard tolerance range refer to a percentage difference, or an amount, depending on the process, above and/or below the pre-process temperature data or the baseline temperature data. The hard tolerance range encompasses the soft tolerance range. The thermal stability of the substrate support assembly may usually be considered acceptable as long as the post-process temperature data falls within the hard tolerance range of the pre-process temperature data, or alternatively the process temperature data falls within the hard tolerance range of the baseline temperature data.

Depending upon the user's requirement, the substrate support assembly whose post-process temperature data falls outside of the soft tolerance range of the pre-process temperature data, or alternatively whose process temperature data falls outside of the soft tolerance range of the baseline temperature data, may warrant attention, and an alarm may be issued. In the event that the post-process temperature data falls outside of the hard tolerance range of the pre-process temperature data, or alternatively the process temperature data falls outside of the hard tolerance range of the baseline temperature data, a process or a future process may be stopped. Thus, if a problem is detected with a parameter of temperature data while recording post-process temperature data, or even while recording process temperature data, such as the post-process temperature data falling outside of the hard tolerance level of the pre-process temperature data or the process temperature data falling outside of the hard tolerance level of the baseline temperature data, a user can quickly pinpoint the particular parameter of concern, the particular component of the plasma processing apparatus associated with such parameter, and the particular step or even a sub-step of a particular process step wherein the parameter value begins to deviate from the expected range. This information can be used to determine a process adjustment or a repair process to allow the plasma processing apparatus to be brought back into production quickly.

In a preferred embodiment the process temperature data is filtered so as to reduce noise collected while recording the process temperature data. The process temperature data can be filtered by averaging the process temperature data over time, finding the mean, maximum, or minimum of the process temperature data. The pre-process temperature data and/or the post-process temperature data is preferably collected while the substrate support assembly is powered to achieve a steady state of the desired spatial and temporal temperature of the upper surface of the substrate support assembly. In an embodiment, the mean of the pre-process and post-process temperature data is found for a comparison therebetween.

In a preferred embodiment, wherein the process temperature data is used to establish or update the baseline temperature data, recorded outlier temperature data is removed from the process temperature data. The outlier temperature data is preferably determined using a statistical method wherein the outlier temperature data is removed in order to elucidate any potential problems that may affect the overall results of determining the baseline from the process temperature data. Preferably the outlier temperature data is removed by using a Dixon Q-test to remove suspected outlier temperature data from the process temperature data. The Dixon Q-test is preferably configured to remove outlier process temperature data by analyzing the recorded process temperature data with a confidence level of 90%, and more preferably with a confidence level of 95% or 99%.

In a preferred embodiment, the pre-process temperature data, the post-process temperature data, and/or the process temperature data is preferably analyzed such that the spatial and temporal temperature of the upper surface of the substrate support assembly can be determined, and more preferably, the temperature output of each of the independently controllable heater zones of the substrate support assembly can be determined. In a preferred embodiment, each independently controllable heater zone of the substrate support assembly is formed so as to correspond to a respective device die location of a substrate to be processed in the plasma processing apparatus. In this manner, the thermal stability of each independently controllable heater zone corresponding to a respective device die location can be determined. Accordingly, the thermal stability of the substrate support assembly, and more preferably the thermal stability of each independently controllable heater zone corresponding to a respective device die location of a substrate to be processed in the plasma processing apparatus can be determined. Thus, if the post-process temperature data is not within the desired tolerance of the pre-process temperature data, or alternatively the process temperature data is not within the desired tolerance range of the baseline temperature data, a component of the plasma processing apparatus, or a process performed in the plasma processing apparatus can be identified as requiring inspection, maintenance, repair, and/or updated input parameters.

In a preferred embodiment, the array of thermal control elements are supplied power through a scalable multiplexing layout scheme of the independently controllable heater zones thereof by a power supply. By tuning the power of the thermal control elements which form the independently controllable heater zones, wherein each independently controllable heater zone is formed by one or more thermal control elements of the array of thermal control elements, the temperature profile of the upper surface of the substrate support can be temporally controlled, and shaped both radially, azimuthally, and in a die by die or coordinate configuration during processing.

The power supply, electrically connected to the array of thermal control elements, can be controlled to supply current at a sufficient range and for a period of time sufficient to achieve a desired temperature in each independently controllable heater zone beneath the substrate, wherein the substrate support assembly preferably includes an independently controllable heater zone corresponding to each die location of the substrate supported on an upper surface thereof. In a preferred embodiment, voltage across each thermal control element or each group of thermal control elements of the array of thermal control elements is held constant. For example, the power supply can supply currents having the same value to each of the thermal control elements forming an independently controllable heater zones beneath the substrate. Alternatively, the currents supplied to each of thermal control elements forming an independently controllable heater zone may have different values, wherein the current supplied to each thermal control element is selected to achieve a desired temperature of the independently controllable heater zone. Further, current can be supplied to the thermal control elements forming an independently controllable heater zone to allow dynamic temperature control of the independently controlled heater zone. This dynamic temperature control can compensate for differences in temperatures of the substrate surface at different regions thereof due to the semiconductor processing (e.g., plasma uniformity and RF uniformity), so that a desired temperature distribution across the substrate surface may be maintained during processing.

The spatial and temporal temperature output of the upper surface of the substrate support assembly, or alternatively spatial and temporal temperature output of one or more independently controllable heater zones of the substrate support assembly formed by the one or more thermal control elements, can be determined by analyzing at least two parameters of the recorded time resolved pre-process temperature data, the time resolved process temperature data, and/or the time resolved post-process temperature data. The parameters can include measured parameters and derived parameters such as the level of power supplied to one or more of the thermal control elements in the substrate support assembly forming each independently controllable heater zone (as used herein power), the voltage across one or more of the thermal control elements in the substrate support assembly forming each independently controllable heater zone (as used herein voltage), the current supplied to one or more of the thermal control elements in the substrate support assembly forming each independently controllable heater zone (as used herein current), the resistance of one or more of the thermal control elements forming each independently controllable heater zone (as used herein resistance), the temperature output of the upper surface of the substrate support assembly, and/or the temperature output of one or more independently controllable heater zones of the substrate support assembly. A known relationship between the power supplied to the one or more thermal control elements forming an independently controllable heater zone and the temperature output of the independently controllable heater zone can be used to determine the temperature output of the upper surface of the substrate support assembly, and/or the temperature output of one or more independently controllable heater zones of the substrate support assembly. Further, a maximum deviation of the determined spatial and temporal temperature of the upper surface of the substrate support assembly from the desired spatial and temporal temperature of the upper surface of the substrate support assembly is preferably determined.

In an embodiment, current and/or voltage data are recorded as a function of time. Preferably, current and voltage data as well as any other parameter of temperature data being recorded (measured or derived) are recorded at a high repetition rate, and less preferably at a low repetition rate. For example, preferably current and voltage data are recorded at a rate less than about 5 Hz, and more preferably at a rate of about 0.1 to 2 Hz such as a rate of about 1 Hz. Current and voltage, as well as other parameters of temperature data such as resistance and power of each of the thermal control elements forming an independently controllable heater zone, or the thermal control elements forming each independently controllable heater zone have to be recorded at the same time or in succession with a very short delay during pre-processing, processing, and/or post-processing, to exclude any time dependent effects. In a preferred embodiment, the thermal control elements of the array of thermal control elements, such as the thermal control elements forming an independently controllable heater zone, or the thermal control elements forming each independently controllable heater zone, are configured such that their respective resistances are dependent on a temperature thereof. In an embodiment, the current supplied to at least one thermal control element of the array of thermal control elements, such as the thermal control elements forming an independently controllable heater zone, or the thermal control elements forming each independently controllable heater zone of the substrate support assembly are measured with a hall sensor, DC current transformer, or a resistive shunt.

In an embodiment, the relationship between the power supplied to the thermal control elements forming an independently controllable heater zone, or the thermal control elements forming each independently controllable heater zone, and the temperature output of the substrate support assembly, or the temperature output of one or more independently controllable heater zones of the substrate support assembly is a known relationship. To form the relationship, the temperature output of the upper surface of the substrate support assembly or a portion of the upper surface of the substrate support assembly corresponding to one or more independently controllable heater zones is monitored while the pre-process temperature data, process temperature data, and/or post-process temperature data is recorded. Thus, parameters of temperature data such as current, voltage, power, and/or resistance of the array of thermal control elements can be recorded and a relationship between the aforementioned parameters and monitored temperature output of the upper surface of the substrate support assembly can be established for the pre-process temperature data, the process temperature data, and/or the post-process temperature data, such that the recorded temperature data can be used to determine the temperature output of the substrate support assembly during a pre-process, a process, or a post-process.

In a further embodiment, the spatial and temporal temperature output of the upper surface of the substrate support assembly, or alternatively spatial and temporal temperature output of one or more independently controllable heater zones of the substrate support assembly formed by the one or more thermal control elements can be determined by analyzing at least two parameters of the recorded time resolved pre-process temperature data, the time resolved process temperature data, and/or the time resolved post-process temperature data of the one or more thermal control elements as well as further temperature control components included in the substrate support assembly, such as a fluid-cooled heat sink and/or a heater plate, wherein the parameters of the fluid controlled heat sink and/or heater plate are measured or known.

A thermal measurement device can be used to monitor the temperature output of the upper surface of the substrate support assembly, wherein the thermal measurement device preferably monitors the entire upper surface of the substrate support assembly, or alternatively a portion of the upper surface of the substrate support assembly. In an embodiment, the thermal measurement device can be a test substrate which includes thermocouples, an IR camera, a scanning IR thermometer, or a scanning thermocouple probe. In an alternate embodiment, a scanning probe can be used to measure a specific region of the upper surface of the substrate support assembly. The thermal measurement device can be used to establish a relationship between temperature output of the upper surface of the substrate support assembly and the pre-process temperature data, the process temperature data, and/or the post-process temperature data. After the relationship between the pre-process temperature data, the process temperature data, and/or the post-process temperature data, and the temperature output of the upper surface of the substrate support assembly has been established, the relationship can be used to determine the thermal stability of the upper surface of the substrate support assembly.

In an embodiment, a user can set SPC limits for the process temperature data and/or the post-process temperature data for parameters such as the current and/or voltage and/or any measured or derived parameter, e.g. derived surface temperature of the upper surface of the substrate support assembly, power input, or resistance across a thermal control element or a group of thermal control elements. Further, recorded pre-process temperature data, process temperature data, and/or post-process temperature data collected over time can be presented to a user to show the values and trends thereof over a process or a number of processes, and a relationship therebetween. The recorded pre-process temperature data, process temperature data, and/or post-process temperature data can be used as a feedback method and presented to a user or fed into an algorithm to decide if the process is within the set control limits. The recorded pre-process temperature data, process temperature data, and/or post-process temperature data can also be used in a feed forward method, in which the input parameters for a next process are either automatically altered or altered by a user to compensate for any process changes. The user input can either be based on a recommendation of the recorded parameters, a constant value, or entered freely by the user.

Furthermore, based on the determined thermal stability of the substrate support assembly, input parameters can be corrected before a next substrate or a next batch of substrates are processed. The input parameters can be corrected by automatic compensation, or by informing a user and letting the user correct the input parameter values. For the latter, the apparatus can give recommendations, or let the user decide which parameter to change and by what amount. In this manner of real time diagnosis and analysis, input parameters can be adjusted after each process or step of a process, thereby minimizing the risk of damaging a substrate or a decreased chip yield over a number of substrates. For example, input parameters can be altered for a subsequent plasma process if the process temperature data is outside of the desired tolerance range of the baseline temperature data and/or the post-process temperature data is outside of the desired tolerance range of the pre-process temperature data. Thus the input parameters can be corrected such that subsequent temperature data collected during the subsequent plasma process is within the desired tolerance range of the pre-process temperature data.

The pre-process temperature data, the process temperature data, and/or the post-process temperature data of each of the measured or derived parameters can be stored for long term trending of the thermal stability of the substrate support assembly. Trends can be monitored by an automatic algorithm with defined SPC limits of the thermal stability of the substrate support assembly or presented to the user preferably in a graphical way, or alternatively, in the form of a table.

While embodiments of methods disclosed herein have been described in detail with reference to specific embodiments thereof, it will be apparent to those skilled in the art that various changes and modifications can be made, and equivalents employed, without departing from the scope of the appended claims.

What is claimed is:

1. A method of determining thermal stability of an upper surface of a substrate support assembly in a plasma processing apparatus wherein the substrate support assembly includes an array of electrical heaters that form independently controllable heater zones of the substrate support assembly, and wherein the array of electrical heaters are operable to control the spatial and temporal temperature of the upper surface of the substrate support assembly, the method comprising:

recording time resolved pre-process temperature data of the substrate support assembly before performing a plasma processing process while powering the array of electrical heaters to achieve a desired spatial and temporal temperature of the upper surface of the substrate support assembly, wherein the electrical heaters generate heat when powered;

processing a substrate or a batch of substrates in the plasma processing apparatus while powering the array of electrical heaters to achieve a desired processing spatial and temporal temperature of the upper surface of the substrate support assembly;

recording time resolved post-process temperature data of the substrate support assembly after processing the substrate or the batch of substrates while powering the array of electrical heaters to achieve the desired spatial and temporal temperature of the upper surface of the substrate support assembly;

comparing the post-process temperature data to the pre-process temperature data; and determining if the post-process temperature data is within a desired tolerance range of the pre-process temperature data.

2. The method of claim 1, further comprising
(a) outputting, displaying, and/or storing the pre-process temperature data, the post-process temperature data, the comparison between the pre-process temperature data and the post-process temperature data, and/or the determination of whether the post-process temperature data is within the desired tolerance range of the pre-process temperature data;
(b) alerting a user if the post-process temperature data is outside of the desired tolerance range of the pre-process temperature data wherein the desired tolerance range includes a soft tolerance range and a hard tolerance range, and warning a user if the post-process temperature data is outside of the soft tolerance range of the pre-process temperature data, and/or warning a user or stopping a future plasma process if the post-process temperature data is outside of the hard tolerance range of the pre-process temperature data;
(c) analyzing the pre-process temperature data and/or the post-process temperature data for each of the electrical heaters to determine the spatial and temporal temperature of the upper surface of the substrate support through numerical analysis or analytical modeling, and/or a maximum deviation of the determined spatial and temporal temperature of the upper surface of the substrate support assembly from the desired spatial and temporal temperature of the upper surface of the substrate support assembly;
(d) analyzing the pre-process temperature data and/or the post-process temperature data for each of the electrical heaters as well as known or measured temperature data for a fluid-cooled heat sink and/or heater plate underlying the electrical heaters to determine the spatial and temporal temperature of the upper surface of the substrate support; and/or
(e) finding the mean or steady state of the pre-process and/or post-process temperature data while powering the array of electrical heaters to achieve the desired spatial and temporal temperature of the upper surface of the substrate support assembly.

3. The method of claim 1, further comprising:
(a) recording time resolved process temperature data, the process temperature data being recorded while processing the substrate or the batch of substrates, and determining or updating baseline temperature data from the time resolved process temperature data; or
(b) recording time resolved process temperature data, the process temperature data being recorded while processing the substrate or the batch of substrates, comparing the process temperature data to baseline temperature data, and determining if the process temperature data is within a desired tolerance range of the baseline temperature data.

4. The method of claim 3, further comprising:
(a) outputting, displaying, and/or storing the process temperature data, the comparison between the process temperature data and the baseline temperature data, and/or the determination of whether the process temperature data is within the desired tolerance range of the baseline temperature data;
(b) alerting a user if the process temperature data is outside of the desired tolerance range of the baseline temperature data wherein the desired tolerance range includes a soft tolerance range and a hard tolerance range, and warning a user if the process temperature data is outside of the soft tolerance range of the baseline temperature data, and/or warning a user or stopping the plasma process if the process temperature data is outside of the hard tolerance range of baseline temperature data;
(c) filtering the time resolved process temperature data wherein the process temperature data is filtered by averaging the process temperature data over time; by finding the mean, maximum, or minimum of the process temperature data; or by a least squares linear fitting technique;
(d) analyzing the process temperature data for each of the electrical heaters to determine the spatial and temporal temperature of the upper surface of the substrate support through numerical analysis or analytical modeling, and/or a maximum deviation of the determined spatial and temporal temperature of the upper surface of the substrate support assembly from the desired spatial and temporal temperature of the upper surface of the substrate support assembly;
(e) analyzing the process temperature data for each of the electrical heaters as well as known or measured temperature data for a fluid-cooled heat sink and/or a heater plate underlying the electrical heaters to determine the spatial and temporal temperature of the upper surface of the substrate support; and/or
(f) removing suspected outlier temperature data from the process temperature data using a Dixon Q-test before determining or updating the baseline temperature data.

5. The method of claim 1, wherein the time resolved pre-process temperature data and/or the time resolved post-process temperature data includes multiple parameters, the parameters including at least two of: the level of power supplied to one or more of the electrical heaters in the substrate support assembly forming each independently controllable heater zone, the voltage across one or more of the electrical heaters in the substrate support assembly forming each independently controllable heater zone, the current supplied to one or more of the electrical heaters in the substrate support assembly forming each independently controllable heater zone; the resistance of one or more of the electrical heaters forming each independently controllable heater zone, the temperature output of the upper surface of the substrate support assembly, and/or the temperature output of one or more independently controllable heater zones of the substrate support assembly.

6. The method of claim 5, wherein the parameters of the pre-process temperature data and/or the post-process temperature data are measured at the same time; or the parameters of the pre-process temperature data and/or the post-process temperature data are measured in succession.

7. The method of claim 5, further comprising measuring the current supplied to at least one electrical heater of the array of electrical heaters with a hall sensor, DC current transformer, or a resistive shunt.

8. The method of claim 5, wherein each parameter of the temperature data is measured at about 0.1 to 5 Hz, or each parameter of the pre-process temperature data and/or the post-process temperature data is measured at a rate of about 0.1 to 2 Hz.

9. The method of claim 3, wherein the time resolved process temperature data includes multiple parameters, the parameters including at least two of: the level of power supplied to one or more of the electrical heaters in the substrate support assembly forming each independently controllable heater zone, the voltage across one or more of the electrical heaters in the substrate support assembly forming each independently controllable heater zone, the current supplied to one or more of the electrical heaters in the substrate support assembly forming each independently controllable heater zone; the resistance of one or more of the electrical heaters forming each independently controllable heater zone, the temperature output of the upper surface of the substrate support assembly, and/or the temperature output of one or more independently controllable heater zones of the substrate support assembly.

10. The method of claim 9, wherein the parameters of the process temperature data are measured at the same time; or the parameters of the process temperature data are measured in succession.

11. The method of claim 9, further comprising measuring the current supplied to at least one electrical heater of the array of electrical heaters with a hall sensor, DC current transformer, or a resistive shunt.

12. The method of claim 9, wherein each parameter of the process temperature data is measured at about 0.1 to 5 Hz, or each parameter of the process temperature data is measured at a rate of about 0.1 to 2 Hz.

13. The method of claim 1, wherein the method is performed by a software algorithm.

14. The method of claim 1, wherein the plasma process is a plasma etching process or a plasma deposition process.

15. The method of claim 1, wherein each independently controllable heater zone of the substrate support assembly is configured to correspond to a respective device die location of a substrate to be processed in the plasma processing apparatus.

16. The method of claim 1, further comprising:
   (a) monitoring the temperature output of the upper surface of the substrate support assembly with a thermal measurement device and determining a relationship between the temperature output of the upper surface of the substrate support assembly and the pre-process temperature data and/or the post-process temperature data; and/or
   (b) identifying a system or a subsystem of the plasma processing apparatus which requires inspection, maintenance, and/or repair if the post-process temperature data is not within the desired tolerance range of the pre-process temperature data.

17. The method of claim 4, wherein the Dixon Q-test is performed with (a) a confidence level of 90%, (b) a confidence level of 95%, or (c) a confidence level of 99%.

18. A non-transitory computer readable medium comprising program instructions for performing the method of claim 1.

19. A control system configured to control processes performed by a plasma processing apparatus comprising the computer readable medium of claim 18.

20. The method of claim 3, further comprising altering input parameters for a subsequent plasma process if the process temperature data is outside of the desired tolerance range of the baseline temperature data such that subsequent temperature data collected during a subsequent plasma process is within the desired tolerance range of the baseline temperature data.

21. A method of determining thermal stability of an upper surface of a substrate support assembly in a plasma processing apparatus wherein the substrate support assembly includes an array of thermal control elements, wherein one or more thermal control elements of the array of thermal control elements form independently controllable heater zones of the substrate support assembly, and wherein the array of thermal control elements are operable to control the spatial and temporal temperature of the upper surface of the substrate support assembly, the method comprising:
   recording time resolved pre-process temperature data of the substrate support assembly before performing a plasma processing process while powering the array of thermal control elements to achieve a desired spatial and temporal temperature of the upper surface of the substrate support assembly;
   processing a substrate or a batch of substrates in the plasma processing apparatus while powering the array of thermal control elements to achieve a desired processing spatial and temporal temperature of the upper surface of the substrate support assembly;
   recording time resolved post-process temperature data of the substrate support assembly after processing the substrate or the batch of substrates while powering the array of thermal control elements to achieve the desired spatial and temporal temperature of the upper surface of the substrate support assembly;
   comparing the post-process temperature data to the pre-process temperature data;
   determining if the post-process temperature data is within a desired tolerance range of the pre-process temperature data;
   recording time resolved process temperature data, the process temperature data being recorded while processing the substrate or the batch of substrates, and determining or updating baseline temperature data from the time resolved process temperature data; and
   removing suspected outlier temperature data from the process temperature data using a Dixon Q-test before determining or updating the baseline temperature data,
   wherein the Dixon Q-test is performed with (a) a confidence level of 90%, (b) a confidence level of 95%, or (c) a confidence level of 99%.

* * * * *